(12) United States Patent
Scheidegger et al.

(10) Patent No.: US 7,489,496 B2
(45) Date of Patent: *Feb. 10, 2009

(54) HV CAPACITOR AND TESTING METHOD

(75) Inventors: Cedric Scheidegger, Villeneue (CH); Pocol Sorin, Corninboeuf (CH); Gerald Meyer, Euney (CH)

(73) Assignee: Maxwell Technologies, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/668,411

(22) Filed: Jan. 29, 2007

(65) Prior Publication Data

US 2007/0183119 A1 Aug. 9, 2007

Related U.S. Application Data

(63) Continuation of application No. 11/016,114, filed on Dec. 17, 2004, now Pat. No. 7,170,738.

(60) Provisional application No. 60/575,597, filed on May 28, 2004.

(51) Int. Cl.
*H01G 4/06* (2006.01)
*H01G 4/20* (2006.01)
*H01G 4/32* (2006.01)

(52) U.S. Cl. .......... 361/313; 361/301.5; 361/306.1; 29/25.42

(58) Field of Classification Search .......... 361/541, 361/530, 522, 517, 511, 301.5, 303–305, 361/306.1, 308.1, 308.2, 308.3, 323; 29/25.03, 29/25.42

See application file for complete search history.

(56) References Cited

U.S. PATENT DOCUMENTS

| | | | |
|---|---|---|---|
| 2,186,842 A | 1/1940 | Scoville | |
| 3,854,196 A | 12/1974 | Derrick et al. | |
| 4,228,481 A | 10/1980 | DiNicola et al. | |
| 6,249,423 B1 | 6/2001 | O'Phelan et al. | |
| 6,585,917 B2 | 7/2003 | Sletson et al. | |
| 7,170,738 B2 * | 1/2007 | Scheidegger et al. | 361/313 |
| 2002/0179890 A1 | 12/2002 | Sletson et al. | |
| 2003/0006738 A1 | 1/2003 | Duff, Jr. | |
| 2003/0133255 A1 | 7/2003 | Reiner et al. | |

FOREIGN PATENT DOCUMENTS

WO 200154151 A1 7/2001

* cited by examiner

*Primary Examiner*—Eric Thomas
(74) *Attorney, Agent, or Firm*—Hensley Kim & Holzer, LLC (57) ABSTRACT

A high voltage capacitor design is provided that provides improved performance. The high voltage capacitor includes a stack of mechanically joined capacitor cells, which in one variant utilize a separator formed of two layers of paper. In one version, the high voltage capacitor may be used as a capacitative voltage divider.

22 Claims, 12 Drawing Sheets

Prior Art

HV CAPACITOR AND TESTING METHOD

CROSS-REFERENCE TO RELATED APPLICATIONS

The present invention is a continuation application of and claims the benefit of and priority from the prior-filed U.S. nonprovisional patent application Ser. No. 11/016,114, filed Dec. 17, 2004, entitled "Improved HV Capacitor and Testing Method" (to issue Jan. 30, 2007 as U.S. Pat. No. 7,170,738), which is related to and claims priority from commonly assigned US Provisional Application S.N. 60/575,597, filed May 28, 2004, which is incorporated herein by reference.

INTRODUCTION

The present invention is generally related to capacitor cells and their manufacture and to HV capacitors and their manufacture more particularly.

BACKGROUND

The manufacture and/or testing of high voltage (HV) capacitors used in high voltage power transmission utilizes processes that in many respects can be improved. HV capacitors are typically very heavy and bulky; an exemplary HV capacitor weighs 50 Kg and is 2 meters long. In one variant, HV capacitors can be configured for use as a CVD (Capacitor Voltage Divider).

Figure 6A:
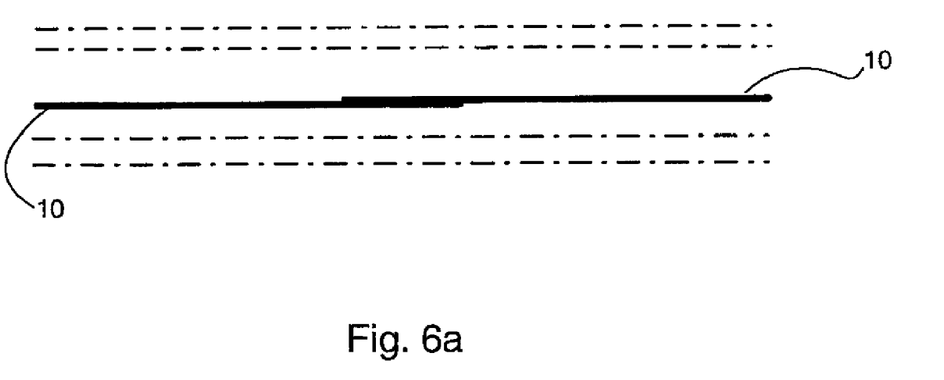
In FIG. 6a there is seen a mechanical bond that does not interfere with an electrical field.
Figure 6B:
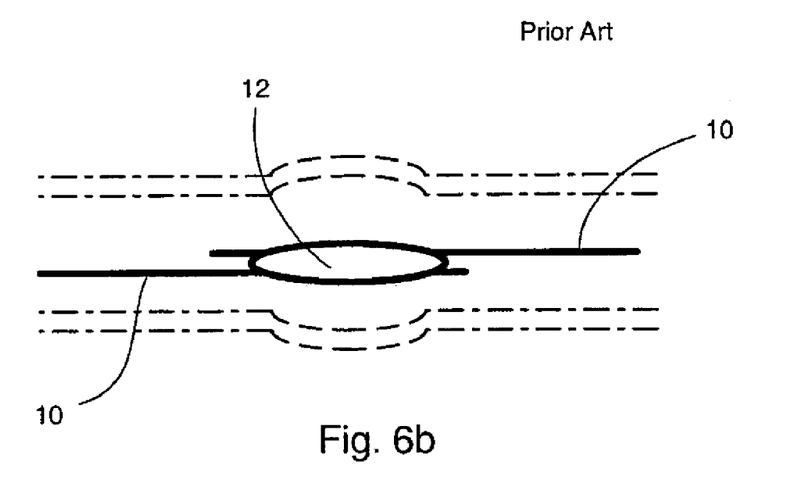
In FIG. 6b, there is seen a prior art mechanical bond that interferes with an electrical field.

The manufacture of HV capacitors typically includes the assembly of a series string or stack of capacitor cells, which are subsequently inserted into an open capacitor housing. In the prior art, individual capacitor cells are joined in series by means of the introduction of additional material, which is used to form of a bond between the cells. FIG. 6b illustrates bonding of two aluminum foils 10 of respective capacitor cells by use of additional material 12, for example a solder, a conductive glue, a joining tab, etc. As represented by dashed lines in FIG. 6b, the additional material may act to deform an electrical field that is formed when an electric potential is present across the aluminum foils; degraded performance may be one consequent result. In the prior art, after insertion of cells in an unsealed housing, the housing is placed into a large oven chamber. With oven closed, the capacitor housing and capacitor cells within are subjected to one or more cycle of vacuum and/or high temperature so as to remove moisture from the cells and the interior of the housing. Increased oven drying throughput may be achieved by drying more than one HV capacitor housing (a batch) at a time, but the oven size needs to be increased accordingly. For example, in order to accommodate a batch of 125 HV capacitor housings, in one embodiment an interior of a drying oven is dimensioned to be on the order of about 3×5×5 meters. Although large ovens can permit a large number of capacitor housings to be dried at one time, a large amount of unused free volume remains within the oven, which requires that more air be evacuated and/or more air be heated to maintain a given temperature or vacuum within the oven; increased drying time and/or increased energy usage may be a consequent result.

After drying, the HV capacitor housings are physically removed from the oven for impregnation. The unsealed HV capacitor housings are removed from the oven and immersed or filled in their entirety in a vat or tank of impregnation fluid so as to fully impregnate the interior of the housings and capacitor cells therein. After the impregnation step, each capacitor housing is individually fitted and sealed with sealing end caps. Each sealing end cap may include terminals, with which external electrical access to the capacitor cells within the housing may be made.

In the prior art, impregnation of HV capacitors, whether individually or as a batch, is a very dirty and messy process that leaves residues of impregnation fluid on the exterior of each capacitor housing, as well, about the surrounding environment. Consequently, after sealing of a capacitor housing with sealing end caps, impregnation fluid typically needs cleaned from the housing exterior and other exposed apparatus. After impregnation and cleaning, the HV capacitor housings are reinserted into the oven, the temperature of which is raised again so as to increase the temperature of the impregnation fluid within the sealed housings. The increased temperature increases pressure within the now sealed capacitor housings. After an extended period of time, the HV capacitor housings are removed from the oven and inspected for leakage of impregnation fluid, particularly at sealed electrical connection points and end caps. If no leaks are detected, the HV capacitors are tested under application of a high voltage, and if the HV test is passed, the HV capacitors can be made available for use.

Variations in the order of testing, heating, and impregnation to that described above may exist in the prior art, but have in common that during each movement, test, and dis/assembly step, the HV capacitors and cells are exposed to impurities, moisture, and other undesired materials. The undesired materials may to some extent be reduced by extra time consuming drying and vacuum steps but, nevertheless, are always present. Performance of prior art capacitors is consequently negatively affected.

It is desired to improve upon one or more aspects of the prior art.

SUMMARY

In one embodiment, a capacitor comprises a plurality of interconnected capacitor cells, each capacitor cell including an aluminum foil, wherein a conductor of one capacitor cell is connected to conductor of another capacitor cell by a mechanically formed bond. The capacitor cells may comprise an insulator; a separator; and a conductor, wherein the insulator is disposed over the separator, and the separator is disposed over the conductor. The separator may comprise two layers. In one embodiment, the separator layer is about 10 μm in thickness. The separator may comprise two layers of paper. The separator may comprise a thickness of about 20 μm. The insulator may comprise polypropylene, and the conductor may comprise aluminum. In one embodiment, the capacitor may comprise a capacitative voltage divider. Each capacitor cell may comprise a capacitance of above 20 nf. In one embodiment, the mechanical bond is formed by a cold weld. In one embodiment, the mechanical bond is formed at a relatively low temperature. In one embodiment, with a potential applied across the capacitor, an electric field is created within the capacitor, and the electric field is minimally altered by the mechanically formed bond.

In one embodiment, a high voltage capacitor comprises a capacitor cell, each capacitor cell including an insulator, two or more layers of separator, and a conductor, wherein the insulator is disposed over the two or more layers of separator, and the two or more layers of separator are disposed over the conductor. The capacitor may comprise a voltage rating of above 10 KV. The two or more layers of separator may comprise paper. Each layer of separator may comprise a thickness of about 10 μm. The capacitor cells may be disposed within a sealed housing, wherein the housing comprises a plurality of fins.

In one embodiment, a method of making a capacitor includes the steps of: providing a conductor; providing a separator over the conductor; providing an insulator over the separator; rolling the conductor, separator, and insulator to form a capacitor cell; and mechanically forming a bond between the conductor and a conductor of another similarly formed capacitor cell. The separator may comprise two layers. The separator may comprise paper. The method may further include a step of configuring the capacitor as a capacitative voltage divider. In one embodiment, the mechanical bond is formed by a cold weld.

Other variants, embodiment, benefits, and advantages will become apparent upon a reading of the Specification and related Figures.

FIGURES

In now to FIG. 3, there is seen not to scale representations of two capacitor cells connected in series.

INVENTION

Reference will now be made in detail to several embodiments of the invention that are illustrated in the accompanying drawings. Wherever practical, same or similar reference numerals are used in the drawings and the description to refer to the same or like parts or steps, however, to simplify the disclosure the same or similar reference numerals may in some instances refer to parts or steps that comprise variants of one another. The drawings are in simplified form and not to precise scale. For purposes of convenience and clarity directional terms, such as top, bottom, left, right, up, down, over, above, below, beneath, rear, front, and other terms may be used with respect to the accompanying drawings. These and similar directional terms should not be construed to limit the scope of the invention. The words "couple", "connect" and similar terms with their inflectional morphemes are used interchangeably, unless the difference is noted or otherwise made clear from the context. These words do not necessarily signify direct connections, but may include connections through intermediate components and devices. Details in the Specification and Drawings are provided to enable and understand inventive principles and embodiments described herein and, as well, to the extent that would be needed by one skilled in the art to implement the principles and embodiments covered by the scope of the claims. The words "embodiment" refers to particular apparatus or process, and not necessarily to the same apparatus or process. Thus, "one embodiment" (or a similar expression) used in one place or context can refer to a particular apparatus or process; the same or a similar expression in a different place can refer to a different apparatus or process. The number of potential embodiments is not necessarily limited to one or any other quantity.

Figure 1:
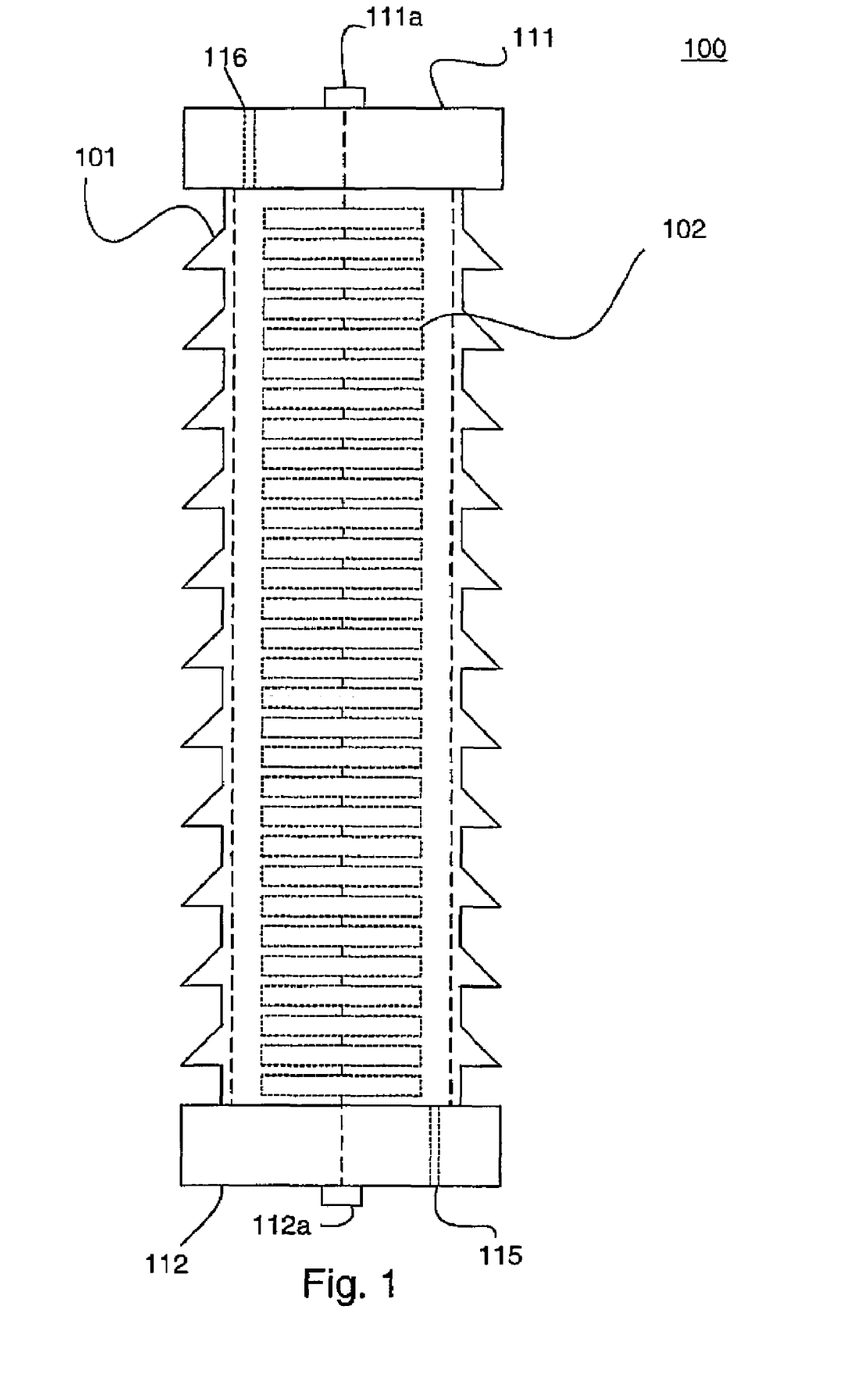
In FIG. 1, there is seen a not to scale representation of a HV capacitor.

Referring to FIG. 1, there is seen a not to scale representation of a HV capacitor. In one embodiment, a HV capacitor 100 comprises a housing 101 and a plurality of capacitor cells 102 disposed within. The capacitor cells 102 are connected in a series string, with the number of capacitors in the string dictated by a desired nominal operating voltage of the capacitor 100. Electrical access to ends of the series string of capacitor cells 102 is provided by sealed terminals 111a, 112a. In a typical configuration, a HV capacitor 100 includes a plurality of ribs; the ribs facilitate cooling of the HV capacitor and, as well, provide a geometry and material to which impurities have difficulty adhering to.

Figure 2:
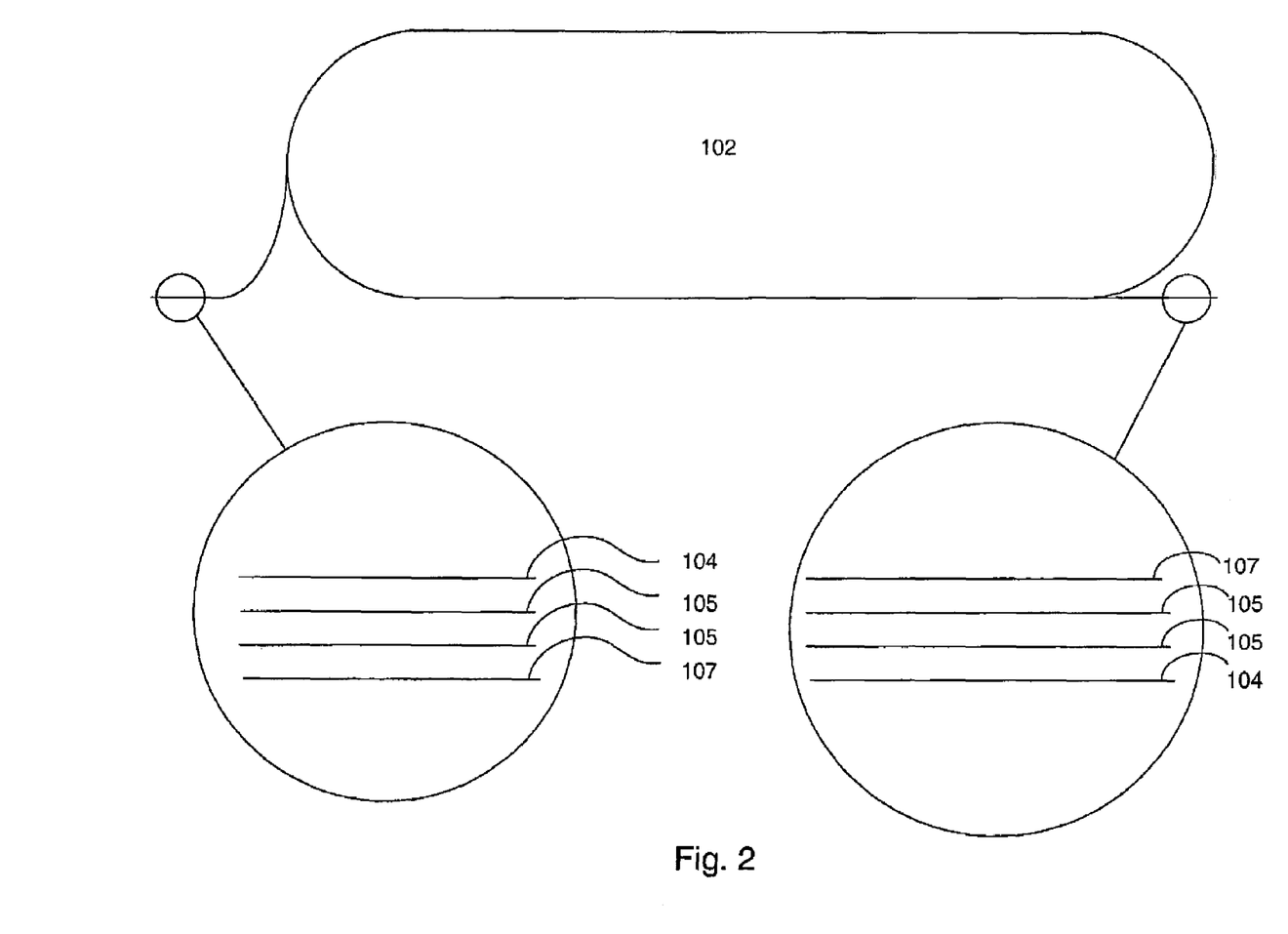
In FIG. 2, there is seen a not to scale cross-section of a rolled capacitor cell with exploded views of a right end and a left end of a cell.

Referring now to FIG. 2, and other Figures as needed, there is seen a not to scale cross-section of a rolled capacitor cell with exploded views of a right end and a left end of a cell. In one embodiment of the present invention, a capacitor cell 102 comprises a combination of insulator, separator, and conductor. In one embodiment, capacitor cell 102 is formed by disposing a layer of insulative polypropylene 104 over one or more layers of paper product separator 105, and disposing the one or more layers of paper product separator over a layer of aluminum foil conductor 107. In one particular embodiment, the polypropylene has a thickness of about 12.7 microns, the paper layers have a thickness of about 20 microns, and the aluminum foil has a thickness of about 10 microns. It is understood, however, that the present invention should not to be limited by dimensions disclosed herein as they may be changed in accordance with design requirements; for example, in other embodiments, the aluminum foil can vary in thickness between 5 μm and 25 μm.

Figure 3:
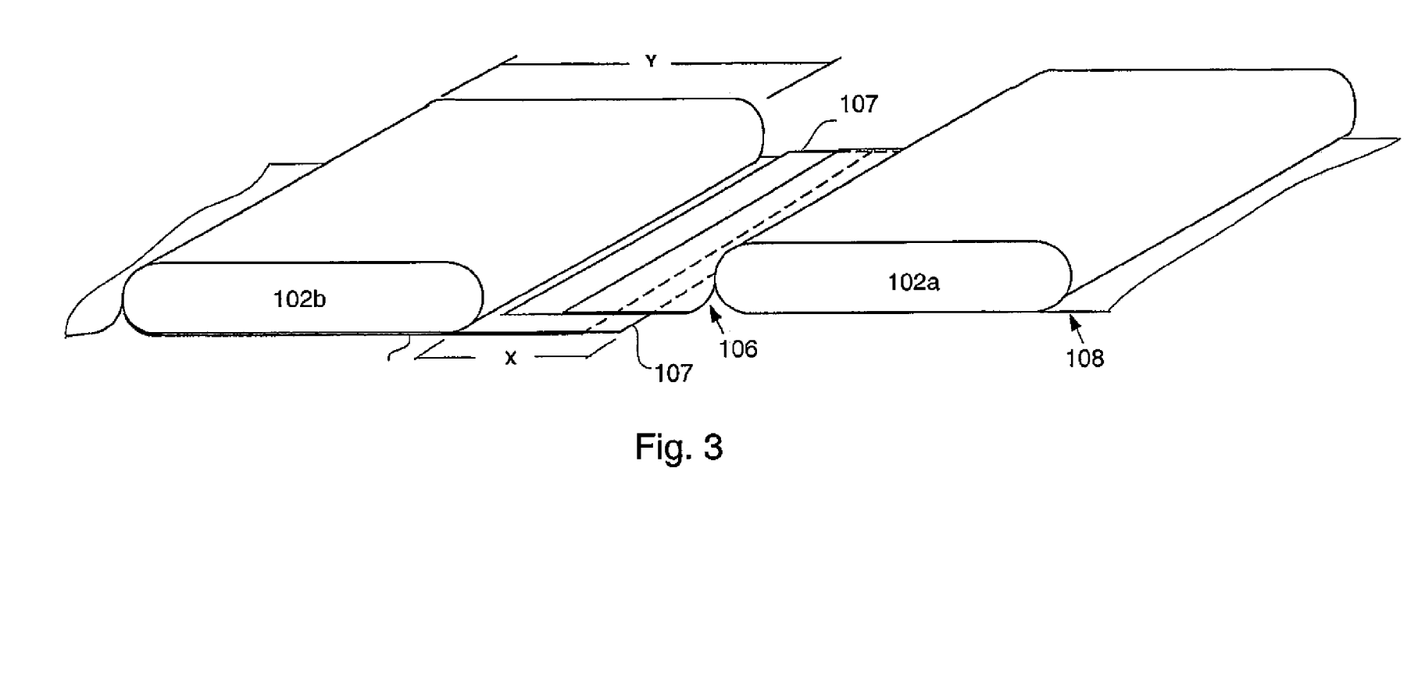

Referring now to FIG. 3, and other Figures as needed, there is seen not to scale representations of two capacitor cells connected in series. As illustrated in FIG. 3, layers of polypropylene, paper, and aluminum foil 107 of a capacitor cells 102a-b are rolled in a manner that provides access to layers at a respective left end 106 and a right end 108 of each capacitor cell. A number of methods can be employed to provide a rolled capacitor cell as illustrated, including taking an initially unrolled length of the layers and folding the length such that the left end and the right end are initially adjacent to each other, and such that what would be an end opposite to the adjacent left and right ends is repeatably rolled as a length "Y" to a point where a certain length of the left end 106 and right end 108 remain unwound and exposed. In one embodiment, the length X at the left and right end that remains unwound is about 45 mm. Also illustrated in FIG. 3 is a layer of aluminum foil 107 left unrolled at the left end 106 and positioned in a bottom orientation, and at the right end 108 a layer of aluminum foil 107 left unrolled in a top orientation. In these orientations, the left end of capacitor cell 102a is alignably disposed over a right end of a previously similarly rolled capacitor cell 102b.

Figure 4:
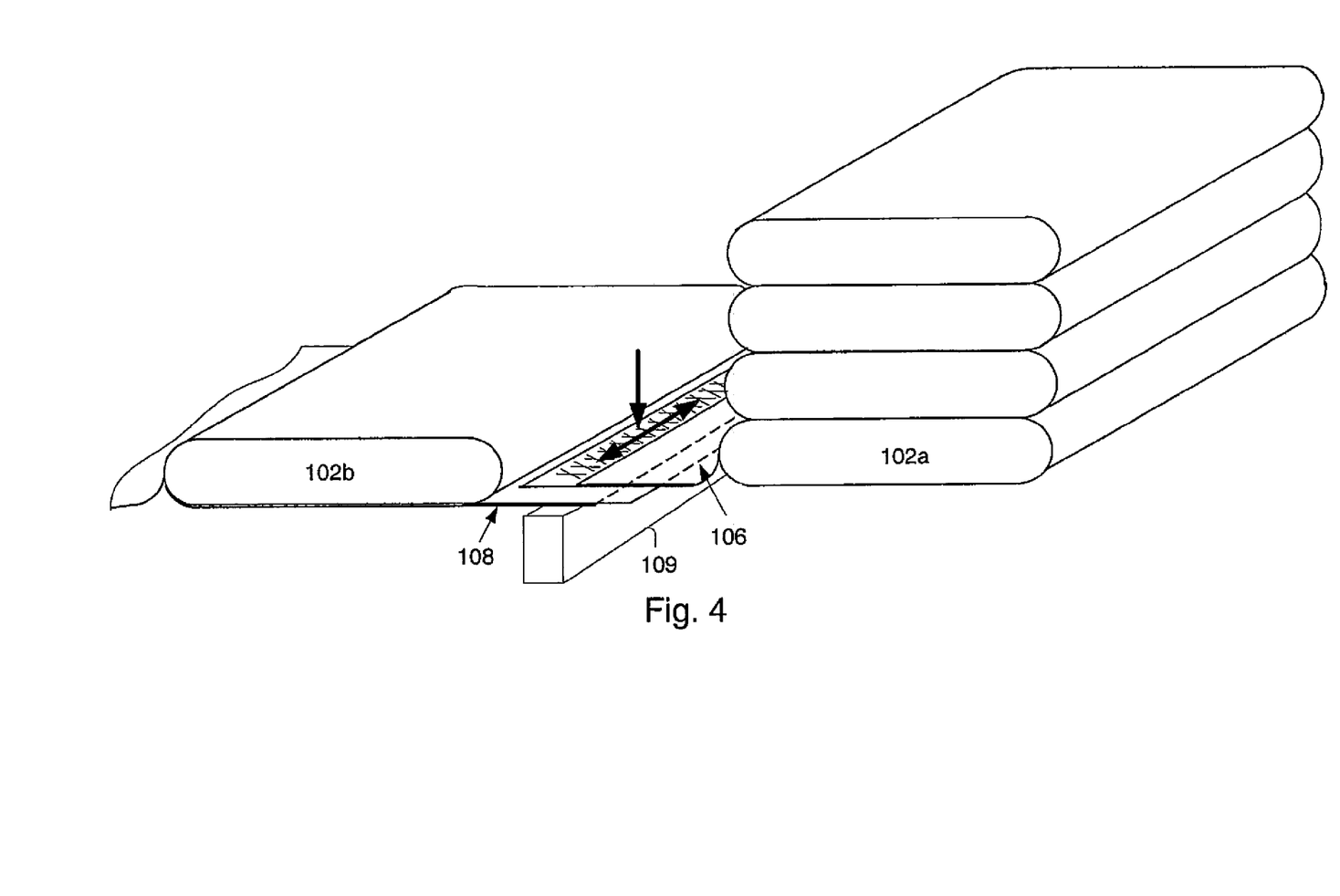
In FIG. 4, there is seen a not to scale representation of a plurality of capacitor cells connected by aluminum foils at their ends.

Referring now to FIG. 4, and other Figures as needed, there is seen a not to scale representation of a plurality of capacitor cells connected by aluminum foils at their ends. In one embodiment, capacitor cell 102a and capacitor cell 102b are bonded by a mechanical bond that joins exposed aluminum foil 107 of a right end 108 of capacitor cell 102b to exposed aluminum foil 107 of a left end 106 of capacitor cell 102a. Repeated mechanical bonding of aluminum foils of respective capacitor cells can be used to form a series string or stack of electrically interconnected capacitor cells. In various embodiments, a nominal voltage rating for a string of capacitor cells is between about 10 KV and 420 KV, with individual nominal cell capacitance ranging between about 20 nf and 10 μf. Other ratings are within the scope of the present invention, as would determined by particular design specification. In one embodiment, 3 μf capacitor cells are connected in series to provide a 170 Kilovolt rated capacitor. In one embodiment, adjacently exposed aluminum foils of a right end of a cell 102b and a left end of a cell 102a are placed over a support 109, and mechanical pressure is applied to press the foils against each other and the support. The mechanical pressure is of a value that allows a mechanical bond to be formed between the two conductors without causing damage or contamination to the conductors and other layers of material that may be present. With mechanical bonding, it is identified that aluminum oxide layers present on the aluminum foils may be penetrated and, thus, better electrical contact between the aluminum foils may be made. Formation of mechanical bonds by pressure applied to aluminum foils at a relatively low temperature is called by those skilled in the art as a "cold weld." In one embodiment, a mechanical bond can also be formed at a raised or relatively high temperature. A mechanical bonding process can be repeated, wherein a bonded capacitor cell 102b is moved to a lower position under a stack of previously bonded cells, and an aluminum foil of a right end of an unbonded capacitor cell is placed next to an aluminum foil of a left end of a previously bonded cell 102b, and the bonding process is repeated on the two foils. The process may be repeated until a desired number of capacitor cells have been bonded in series. Preferably, the dimension X disclosed in FIG. 3, is provided as a length that when cell 102b is moved under cell 102a to form a stack of cells, the right end 108 of cell 102b and the left end 106 of cell 102a can be manipulated and extended without causing damage to the cells 102a and 102b, or bonds formed therebetween.

In one embodiment, mechanical pressure is applied to the positionally exposed aluminum foils of capacitors 102a and 102b, for example, by a hardened metal cylinder that is moved or rolled across the exposed aluminum foils (represented by the two headed arrow). In one embodiment, the roller may comprise a surface that forces a patterned impression to be formed in the aluminum foils, for example, a cross hatch pattern, or the like. Patterned impressions may be used to help mechanically interlock the aluminum foils together and so as to add strength to the bond. The exposed aluminum foils of unconnected capacitors may be positioned and bonded by a manual and/or automated process. Although in one embodiment a roller is identified, in other embodiments, it is understood that exposed aluminum foils could be bonded by other force applying devices and mechanisms, for example, a mechanical press device, etc. Because the present invention does not utilize adhesives, solder, tabs, or other additional products to bond aluminum foils of capacitor cells together, the associated degradation in performance and reliability that occurs in the prior art is reduced or eliminated. As represented in FIG. 6a, without use of additional products to form a bond between conductors, an electrical field that can be formed by a potential applied across the conductors is minimally deformed and, thus, electrical performance of a HV capacitor 100 can be improved over that of the prior art.

Referring back to FIG. 2, it is identified that principles described above can be used in the assembly of a HV Capacitative Voltage Divider (CVD), a type of HV capacitor known to those skilled in the art. In a preferred embodiment, a capacitor cell 102 as used in a CVD includes one layer of polypropylene 104, two layers of paper 105, and one layer of aluminum foil 107. In one embodiment, the polypropylene has a thickness of about 12.7 microns, each layer of paper has a thickness of about 10 microns, and the aluminum foil has a thickness of about 10 microns. Analysis and empirical results have identified that use of two layers of paper 105, enables use of a CVD over a wider range of temperatures than a CVD that would use capacitor cells 102 made with one layer of paper of equivalent thickness.

Figure 5:
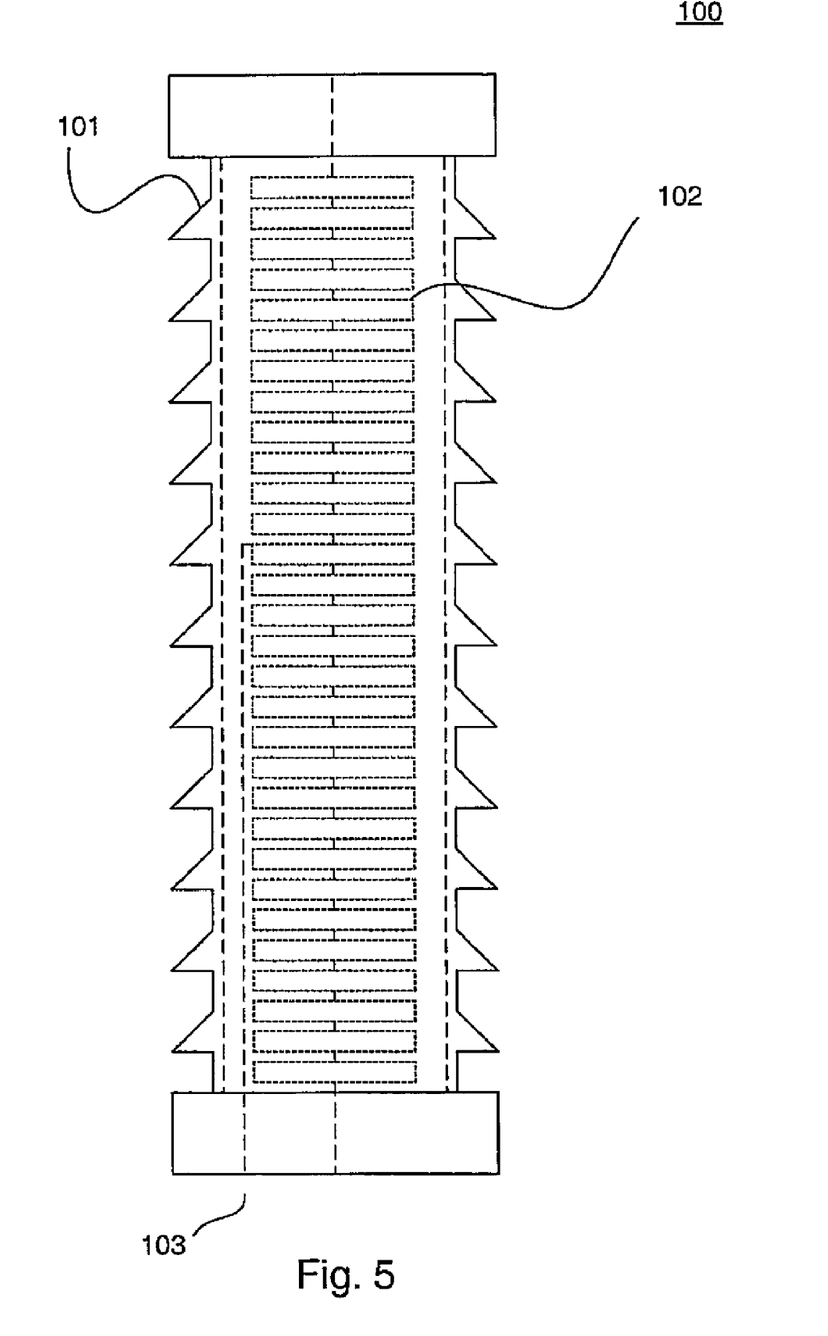
In FIG. 5, there is seen a not to scale representation of a CVD.

Referring now to FIG. 5, there is seen a not to scale representation of a CVD. In one embodiment, a CVD differs from the HV capacitor 100 topology described above in at least one respect; an intermediate connection 103 is included to provide electrical access to an electrical point within a series string of capacitor cells 102. In one embodiment, electrical connection and access at an intermediate connection may be provided by an appropriately dimensioned and positioned intermediate capacitor extending portion. Those skilled in the art will identify that the number of capacitor cells used to configure upper and lower legs of a CVD and, thus, the location of the intermediate connection, would vary according to desired specifications.

Referring back to FIG. 1, and other Figures as needed, there is seen capacitor cells disposed within a housing. After individual capacitor cells 102 are mechanically bonded in series, the resulting stack of cells is electrically coupled to one or more terminals provided with one or more end caps. In one embodiment, the electrically coupled stack is inserted into an appropriately sized housing 101, and end caps 111, 112 are sealably attached to each open end of the housing. In one embodiment, between each end cap and the housing there is provided one or more seal, o-ring, gasket, or the like disposed to seal Sealing of a HV capacitor 100 with end caps at this point in a process facilitates shielding of the interior of the housing from external impurities during subsequent processing steps. With end caps attached to a housing, the resulting embodiment at this point in a process is understood to comprise a capacitor housing, a stack of serially bonded capacitor cells 102 disposed within, and ones one or more sealed end cap, but sans any impregnation fluid, or in other words, the interior of the HV capacitor 100 is without any electrolyte or oil.

Although HV capacitor 100 is sealed by its end caps, the present invention allows that selective access from the exterior to the interior (or interior to the exterior) of the capacitor may be made though one or more sealable port. Although illustrated in one embodiment as two selectively sealable ports 115 and 116, each disposed at respective opposite end caps 111 and 112, it will be understood that in other embodiments, one or more sealable port may be disposed at the same end cap. As well, in other embodiments, one or both end caps 111, 112 may comprise more than two sealable ports. As will be understood, unless a defect or failure is detected during some of the processes described further below, use of sealable ports allows that sealed end caps do not necessarily have to be removed and, thus, time consuming repositioning, dis/assembly, retesting, and/or cleaning steps may be avoided, as would be required in the prior art. Additionally, after sealable attachment of end caps is performed, damaging exposure to external moisture and impurities (as occurs during prior art end cap removal, repositioning, dis/assembly, and or cleaning steps) can be minimized. Exposure to impurities is reduced with the present invention because the interior of the HV capacitor 100 is exposed to an external environment during processing only as determined by a selective opening or closing of its sealable ports. Compare this to the prior art, wherein during required end cap removal process steps, the interior of a HV capacitor is always exposed to an external environment.

Figure 7A:
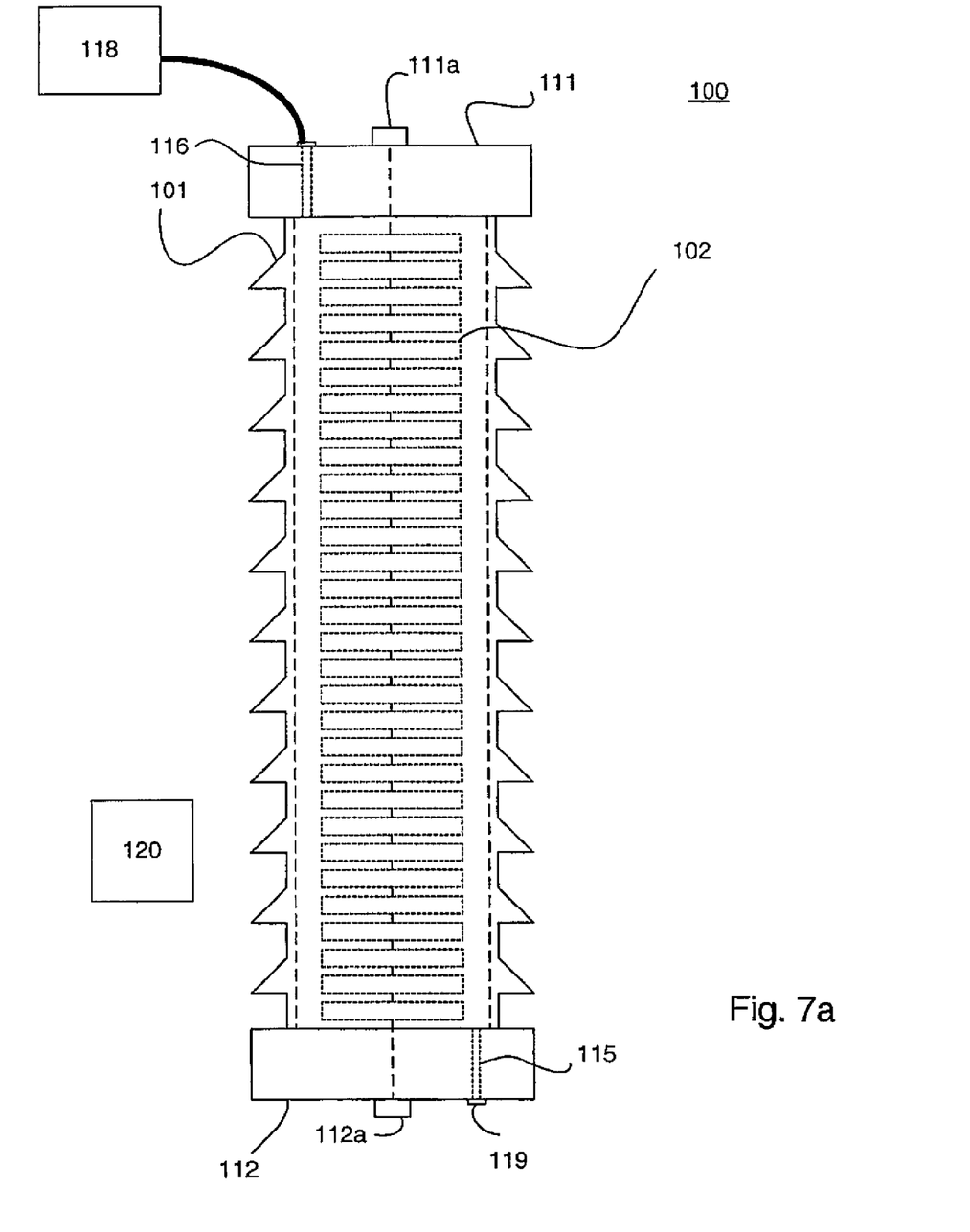
In FIG. 7a, there is seen a not to scale representation of a HV capacitor subject to a leak test.

Referring now to FIG. 7a, there is seen a not to scale representation of a HV capacitor subject to a leak test. In embodiments described further herein, connections to selectively sealable ports, as well as sealable ports themselves, will be understood to utilize or comprise one or more coupler as are used by those skilled in the art to permit quick leak free seals, and/or dis/connections, to be made under pressure and/or vacuum. In one embodiment, the couplers may provide open-flow or no-flow functionality. In one embodiment, when closed, the couplers may provide sealing functionality. In one embodiment, one or more sealable port may be closed or sealed by a sealable insert or plug.

In one embodiment, a sealable port 115 is selectively closed and a sealable port 116 is coupled to a source of fluid or gas 118, for example, a source of low molecular weight and/or inert gas such as helium, or the like. In one embodiment, with pressurized gas 118 applied at sealable port 116, a gas leak detector 120 can be positioned about the HV capacitor 100 so as to verify that gas has or has not leaked out from within the capacitor. In one embodiment, the leak detector 120 comprises a helium leak detector as could be obtained and used by those skilled in the art. A detector 120 may be positioned to detect helium at possible points of leakage, for example, at interfaces between the housing, end caps, sealed ports, and/or electrical terminals.

Figure 7B:
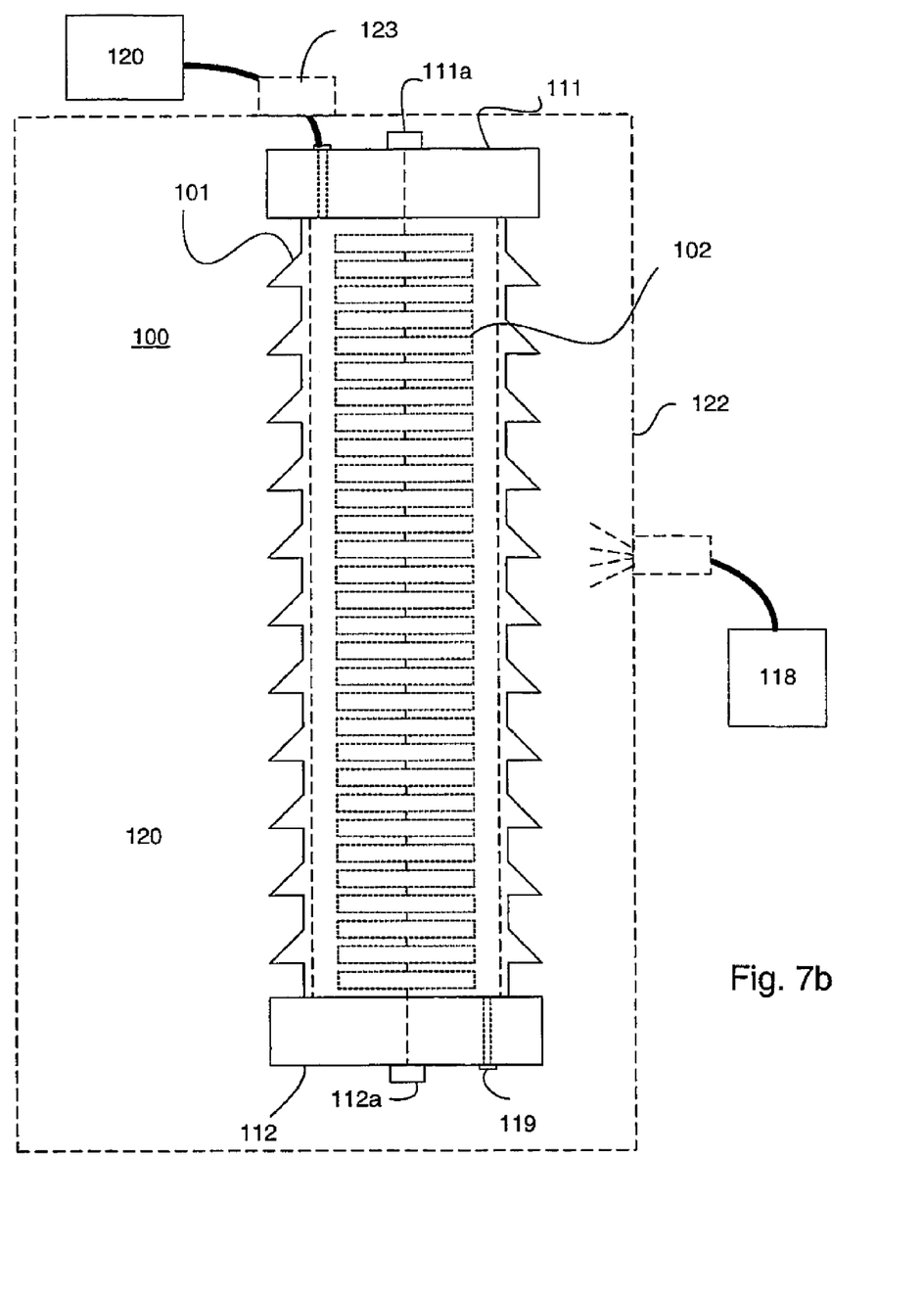
In FIG. 7b, there is seen a not to scale representation of a HV capacitor subject to a leak test.

Referring now to FIG. 7b, there is seen a not to scale representation of a HV capacitor subject to a leak test. In one embodiment, one or more HV capacitor 100 is coupled at a selectively sealable port to a gas detector 120 and, with other provided sealable ports sealed/closed, is exposed to an external source of gas 118, for example, low molecular weight and/or inert gas such as helium, or the like. If no externally applied gas is detected by the gas detector 120, the capacitor housing 101, end caps 111, 112, ports 115, 116 and terminals 111a, 112a may be considered as being sealed sufficiently against leakage of subsequently used impregnation fluid from within the HV capacitor 100.

In one embodiment, it is identified that leak testing may be enhanced by placement of one or more HV capacitor 100 in a chamber 122. In one embodiment, after placement of one or more HV capacitor 100 within chamber 122, hoses and/or couplers 123 within or at walls of the chamber may be used to connect a leak detector 120 to a sealable port of HV capacitor(s) within the oven, and to a source of gas 118. It is identified that if gas is introduced into a chamber 122 that is sealed, the chamber may become pressurized, and that the pressure may be used to accelerate any potential leakage of gas from outside to within the sealed interior of each HV capacitor 100; detection of the gas within a sealed capacitor housing can be used as an indication that the capacitor housing is not properly sealed. The amount of time required to determine if a HV capacitor 100 may be subject to leakage from subsequently used impregnation fluid may accordingly be reduced.

It has been identified that application of a vacuum to the interior of each sealed HV capacitor 100 at a sealable port may be used to accelerate leakage of an externally applied gas and, thus, detection of the gas within a HV capacitor that is improperly sealed. In one embodiment, gas detector 120 itself may comprise a vacuum source (not shown) with which gas from a gas source 118 can be potentially drawn into a leaking HV capacitor 100.

In one embodiment, a gas source 118 or another source of heat may be used to introduce heat into chamber 122. In one embodiment, chamber 122 may provide heating functionality. Cycled heating of the chamber 122 may be used to expand seals and joints of each HV capacitor 100 during leakage testing to better simulate actual operating conditions and possible failure modes that may occur during actual use.

It is identified that testing for leakage as described by the present invention above obviates the need for the extended high temperature testing of HV capacitors as is needed in the prior art. For example, in the prior art, leakage testing is performed by subjecting sealed and impregnation fluid filled HV capacitors to a high temperature for 48 hours; after cooling a subsequent visual inspection is performed to see if any leaked fluid is present outside the capacitor. Compared to the prior art, leakage testing of HV capacitors 100 in a manner as described by the present invention can be performed very cleanly and quickly, and such that testing throughput and reliability can be increased. Because a plurality of HV capacitors 100 may be easily connected at their sealable ports by means of a coupler, and subsequently quickly tested for leakage of a gas (not impregnation fluid as in the prior art), cleaning of leaked or spilled impregnation fluid can be eliminated. Furthermore, leakage testing of prior art HV capacitors requires that they be filled with impregnation fluid and tested in heating ovens for on the order of 48 hours, which contrasts with about 5 minutes as is made possible by the above described gas leak test processes. With the present invention, if leakage of gas is detected, an offending leaking HV capacitor 100 may be quickly disconnected at a sealable port from a source of gas and moved for subsequent disassembly and repair, which differs from the prior art, wherein a leaking HV capacitor, as indicated by leaking impregnation fluid, requires that the capacitor housing and impregnation fluid be cooled, that the capacitor be disassembled, that the impregnation fluid be removed from the housing, and that the capacitor be cleaned, before repair procedures can be implemented.

Figure 8:
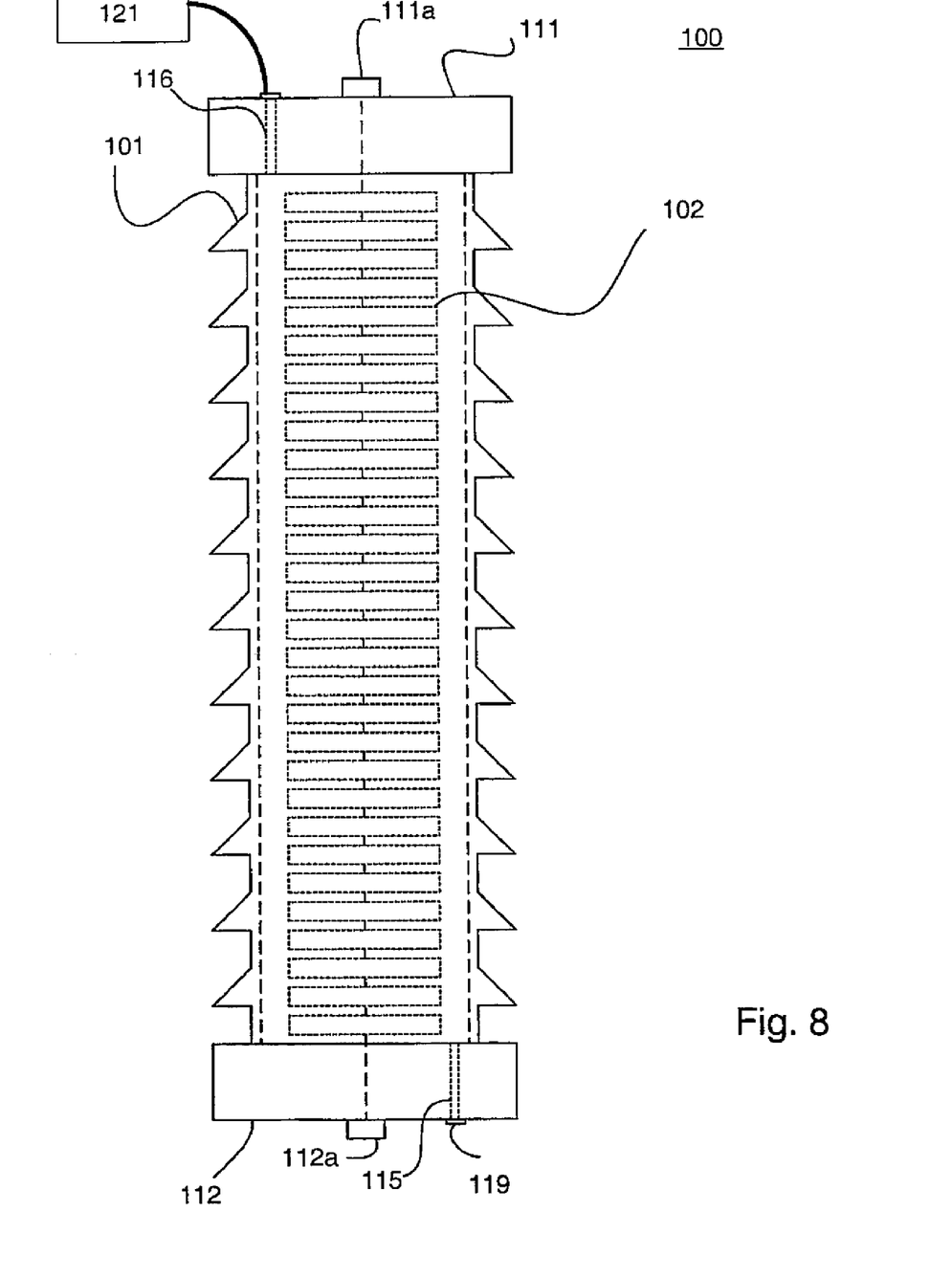
In FIG. 8, there is seen a not to scale representation of a HV capacitor subject to drying.

Referring now to FIG. 8, there is seen a not to scale representation of a HV capacitor subject to drying. Those skilled in the art will identify that in one embodiment, the drying process described herein could in addition to, or on its own, be performed before a gas leak test. If gas leakage testing is performed first, the source of pressurized gas 118 and/or gas leak detector 120 may be disconnected from a selectively sealable port/coupler at which it/they were applied, other sealable ports/couplers may be unsealed/opened, and a drying process may be initiated.

In one embodiment, a sealable port is coupled to a pressurized source of dry and/or inert gas 121. In one embodiment, the gas is heated. The gas is applied at some temperature and/or pressure sufficient to expose and pass over, and through, the capacitor cells 102 within the capacitor housing 101 and such that most or all moisture and other impurities present within the housing is expelled from any unsealed/open port(s), for example, a port 115. One or more of the HV capacitors 100 may be coupled to the same source of gas 121 in manner that allows all the capacitors to be dried at the same time.

Figure 9:
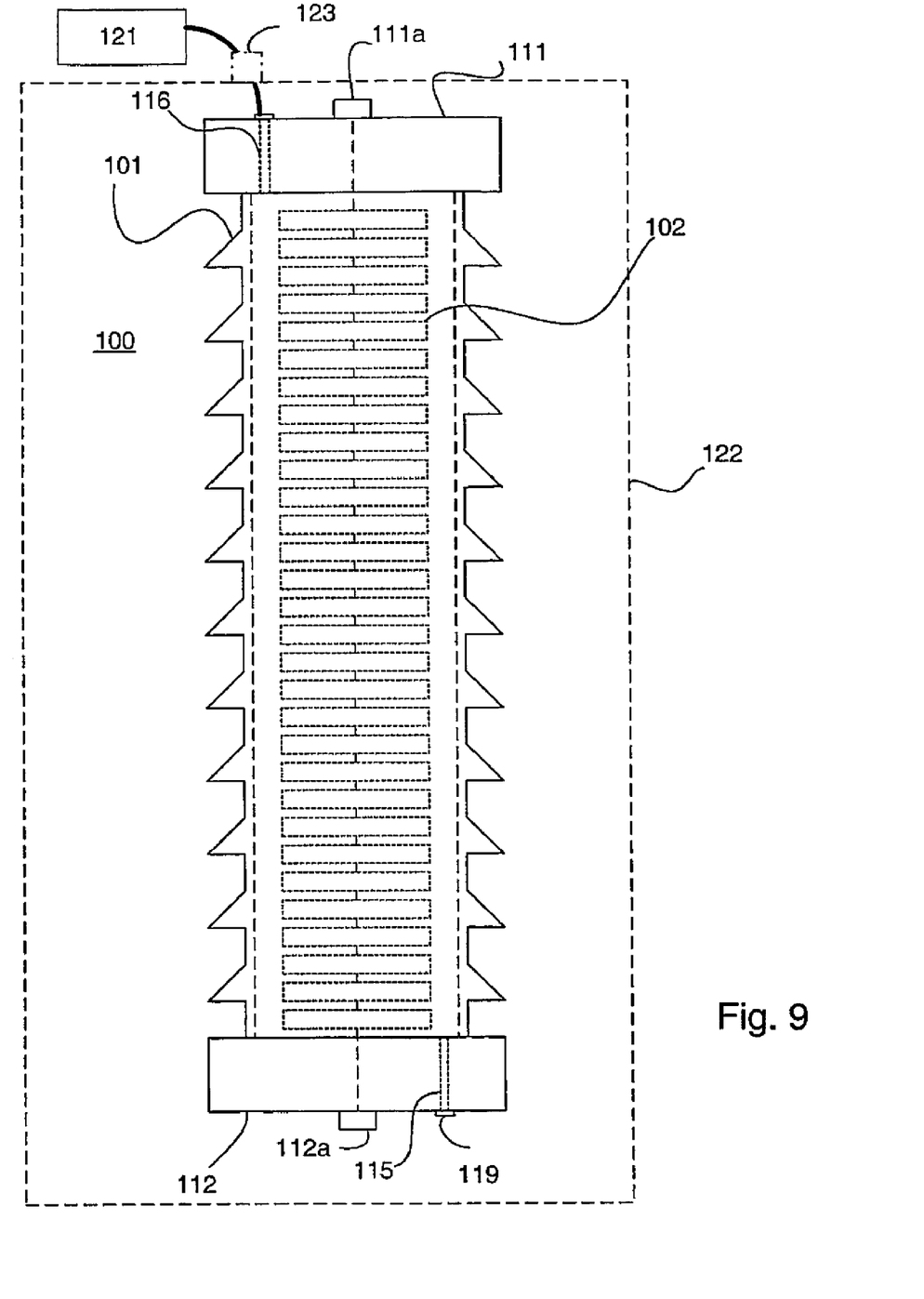
In FIG. 9, there is seen a not to scale representation of a HV capacitor subject to drying.

Referring now to FIG. 9, there is seen a not to scale representation of a HV capacitor subject to drying. In one embodiment, it is identified that a drying process according to the present invention may also be performed by placement of one or more HV capacitor 100 in a chamber 122. In one embodiment, chamber 122 provides oven functionality that may be utilized in conjunction with application of a source of dry and/or inert gas 121. In one embodiment, after placement of one or more HV capacitor 100 within chamber 122, one or more selectively sealable port is connected to a source of gas 121 via hoses and/or couplers 123 provided within or at walls of the chamber, such that gas applied from outside the chamber can be passed through each HV capacitor within the chamber. It is identified that if heated gas 121 is provided, the temperature of the interior of the HV capacitor(s) 100 may be raised independent of the temperature of chamber 122. Accordingly, the amount of time chamber 122 needs to be maintained at a certain temperature to achieve a desired amount of drying of HV capacitor 100 may in many cases be reduced. In contrast, in the prior art, an entire volume of a drying oven needs to be heated in order to sufficiently raise the temperature of the interior of the unsealed open capacitor housings placed therein. Because with the present invention only the relatively small interior volume of each sealed HV capacitor 100, and not the large volume of a chamber actually needs be dried, quicker testing and throughput may be achieved.

Figure 10:
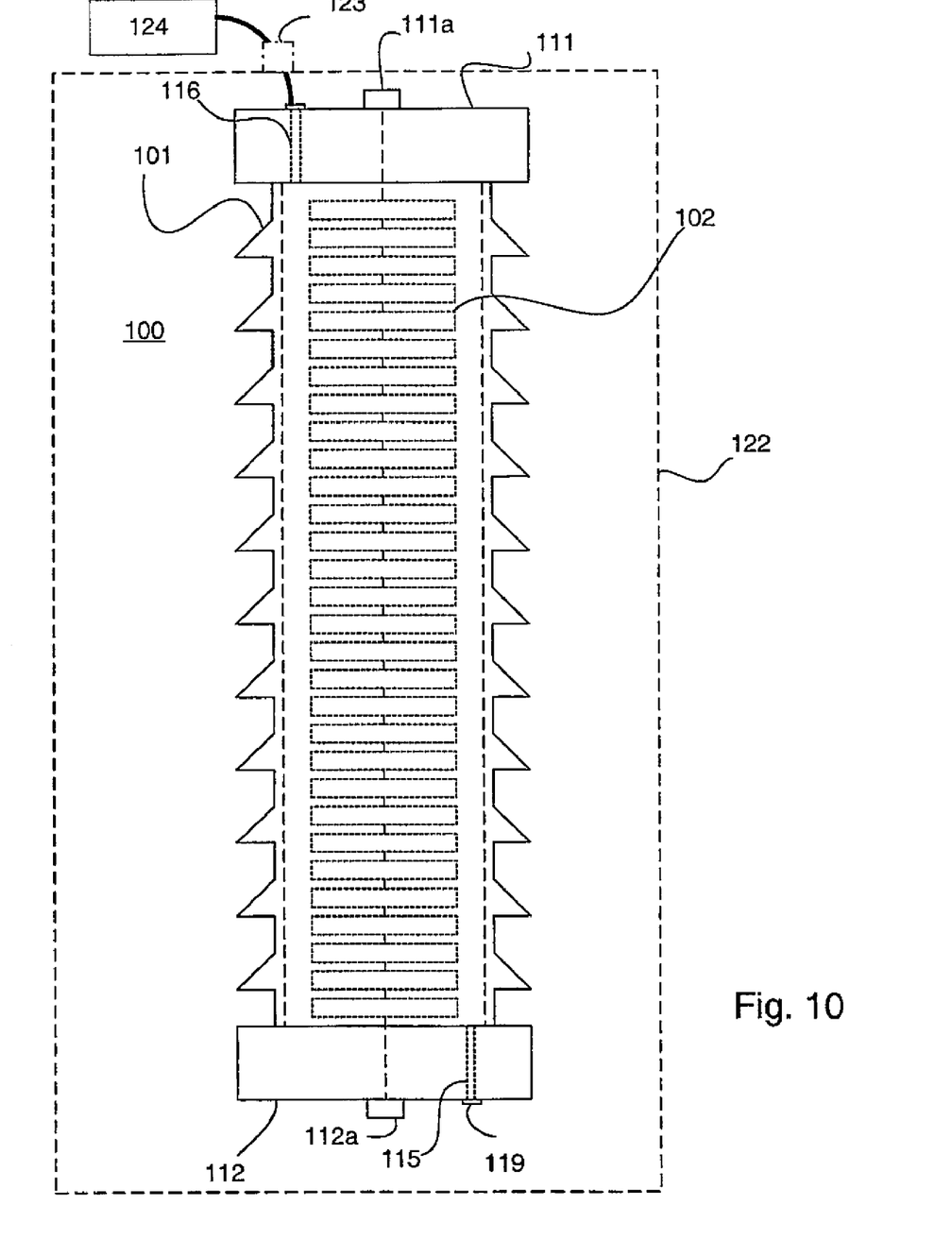
In FIG. 10, there is seen a not to scale representation of a HV capacitor subject to vacuum.

Referring now to FIG. 10, there is seen a not to scale representation of a HV capacitor subject to vacuum. In one embodiment, a HV capacitor 100 may be coupled at one or more selectively sealable port to a vacuum source 124. In one embodiment, sealable ports not coupled to a vacuum source 124 may be sealed or closed. Connections made to vacuum source 124 may be achieved by means of vacuum tight couplers and connections as are know to those skilled in the art. Vacuum may be applied to bring moisture and/or impurity levels within the a sealed HV capacitor 100 to a desired level. In one embodiment, a plurality of HV capacitors 100 may be coupled to the same vacuum source 124 in a manner that allows evacuation of moisture and/or impurities from more than one housing 101 at a time. In one embodiment, vacuum may be applied to each HV capacitor 100 by means of a vacuum source 124 coupled to the chamber 122. In one embodiment, the chamber 122 may provide vacuum functionality.

Figure 11:
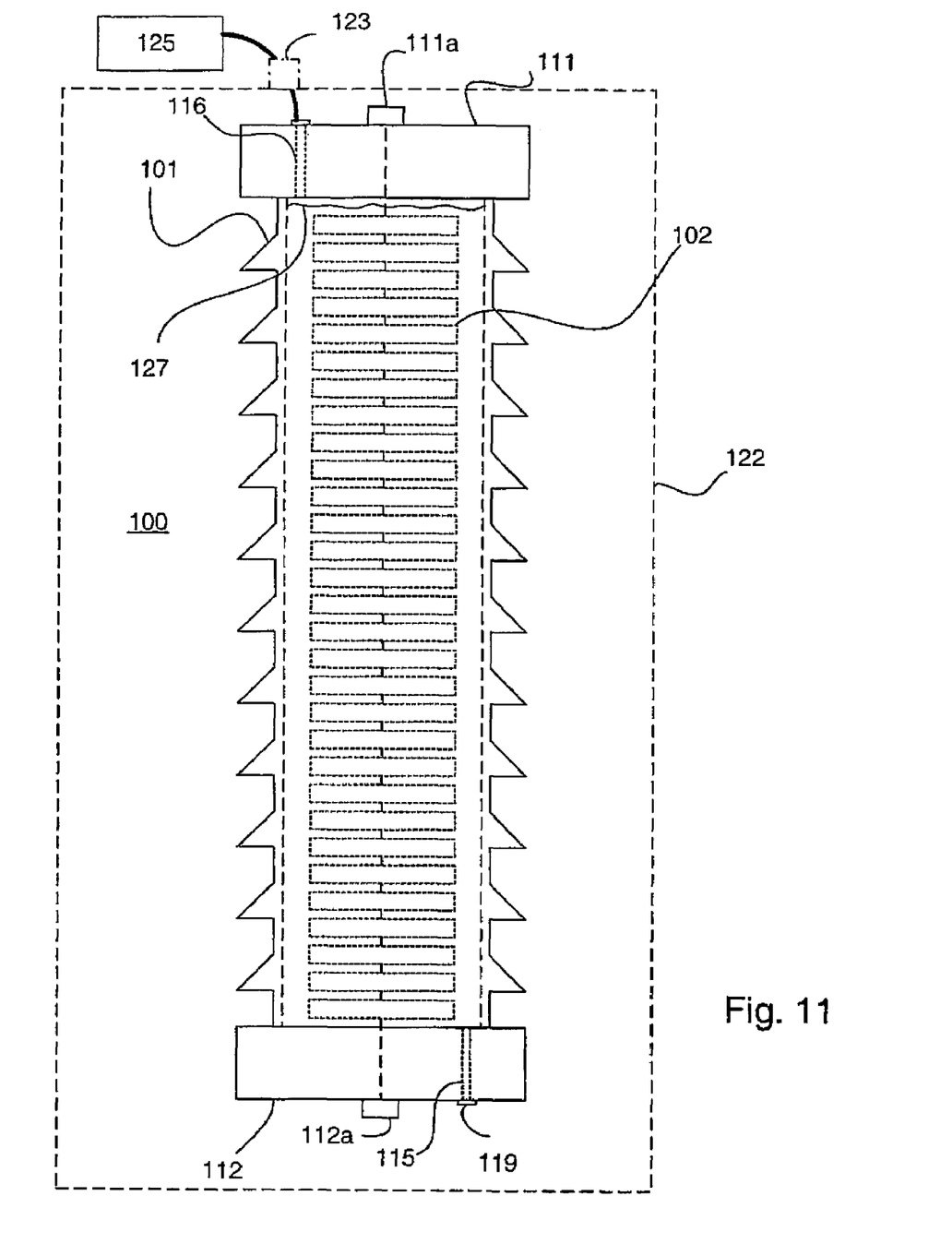
In FIG. 11, is seen a not to scale representation of a HV capacitor subject to impregnation.

Referring now to FIG. 11, there is seen a not to scale representation of a HV capacitor subject to impregnation. In one embodiment, one or more HV capacitor 100 may have one or more selectively sealable port coupled to a source of fluid 125. Fluid 125 is typically used to fill the capacitor housing 101 so as to impregnate capacitor cells 102 and/or to provide a medium with which to dissipate heat generated by the cells. In one embodiment, impregnation fluid 125 comprises an oil as would be used by those skilled in the art. In one embodiment, during filling, sufficient free volume of air is left to allow for expansion of impregnation fluid 127 within a sealed HV capacitor 100 under anticipated operating temperatures. Impregnation fluid 127 may be introduced by filling, under pressure, and/or under vacuum. In one embodiment, impregnation fluid 127 may be applied at one open sealable port and another sealable port may be selectively unsealed/opened sufficiently to allow fluid to be expelled. In one embodiment, expelled fluid and/or air may be directed by means of couplers and hoses to outside chamber 122 or to a container within the chamber. In one embodiment, fluid 127 may be drawn into a HV capacitor 100 at one sealable port with a vacuum applied at a sealable port. Because during impregnation all fluid preferably is contained within each HV capacitor 100, or connections thereto, impregnation of a HV capacitor 100 with fluid 127 can be preferably performed with minimal or no spillage. In one embodiment, impregnation of HV capacitors 100 may be performed inside a chamber 122. In one embodiment, fluids 127 may be introduced to within chamber 122 via hoses and/or couplers 123. If other processing of HV capacitors 100 within a chamber 122 is desired, impregnation within a chamber 122 may be achieved without removal of any HV capacitors 100 from within the chamber before or after such processing, as minimal dis/connection of appropriate hoses to/from respective ports and couplers is all that would be required to change from one source of fluid to another source of fluid. Upon impregnation, if desired, all sealable ports can be quickly and easily selectively closed/sealed by an insert, a screwable plug, or by a coupler 119.

It has, thus, been identified that in accordance with one or more embodiments described herein, a more reliable and better performing HV capacitor can be manufactured. It has further been identified that processing, testing, drying, and impregnation of HV capacitors can be performed in a much shorter period of time than previously possible. For example, the start to end time to process/test a batch of prior art HV capacitors takes 120 hours, whereas the start to end time to process/test the same number of HV capacitors 100 can take less than about 48 hours. Connections to selectively sealable ports of a plurality of HV capacitors 100 may be made quickly and easily in a batch mode using hose type connections and other appropriate fixtures. No or minimal cleanup is required during impregnation with the present invention because easy quick sealable connections are able to made to HV capacitors by means of one or more sealable port. Contrast this to the prior art, wherein after a HV capacitor housing is filled with impregnation fluid in a vat, and afterwards fitted and sealed with end caps, the exterior of prior art housing typically requires extensive cleaning. Also with the present invention, no or a minimal amount of impregnation fluid is wasted and/or contaminated as occurs during prior art immersion in, and removal from, impregnation vats. Because quick, easy, clean dis/connections can be made by and to sources of vacuum, heat, gas, and/or fluids via sealable ports of HV capacitors (outside and/or inside a test chamber), HV capacitor manufacture and testing throughput is increased. Drying, impregnation, and/or leakage tests can be performed without repeated removal of HV capacitors from within a chamber and/or impregnation vat. Because heat, and/or, vacuum, and/or pressurized gas can be applied to HV capacitors within a chamber from a source external to the chamber, the chamber itself may not necessarily require that it provide heat, pressure, and/or vacuum functionality.

Thus, the present invention and embodiments thereof should be limited only by the claims that follow and, as well, by their legal equivalents.

What is claimed is:

1. A capacitor, comprising: a plurality of interconnected capacitor cells, each capacitor cell including an aluminum foil, wherein the aluminum foil of a first capacitor cell is bonded to the aluminum foil of a second capacitor cell by a mechanically formed bond.

2. The capacitor of claim 1, wherein the first capacitor cell comprises an insulator; a separator; and a conductor, wherein the insulator is disposed over the separator, and the separator is disposed over the conductor.

3. The capacitor of claim 2, wherein the separator consists of two layers.

4. The capacitor of claim 3, wherein each separator layer is about 10 µm in thickness.

5. The capacitor of claim 2, wherein the separator comprises two layers of paper.

6. The capacitor of claim 5, wherein the insulator comprises polypropylene, and wherein the conductor comprises the aluminum foil of the first capacitor cell.

7. The capacitor of claim 2, wherein the separator comprises a thickness of about 20 µm.

8. The capacitor of claim 2, wherein the capacitor comprises a capacitive voltage divider.

9. The capacitor of claim 8, wherein with a potential applied across the capacitor an electric field is created within the capacitor, and the electric field is minimally altered by the mechanically formed bond.

10. The capacitor of claim 2, wherein the capacitor comprises a voltage rating of above 10 KV.

11. The capacitor of claim 2, wherein each capacitor cell comprises a capacitance of between about 20 nf and 10 µf.

12. The capacitor of claim 1, wherein the mechanically formed bond comprises a cold weld.

13. The capacitor of claim 1, wherein the mechanically formed bond is formed at a relatively low temperature.

14. The capacitor of claim 1, wherein with a potential applied across the capacitor an electric field is created within the capacitor, and the electric field is minimally altered by the mechanically formed bond.

15. The capacitor of claim 1, wherein the plurality of interconnected capacitor cells are disposed within a sealed housing, and wherein the housing comprises a plurality of fins.

16. The capacitor of claim 1, wherein the plurality of interconnected capacitor cells are mechanically coupled in series via the mechanically formed bond of the aluminum foil of the first capacitor cell to the aluminum foil of the second capacitor cell.

17. The capacitor of claim 1, wherein the mechanically formed bond comprises a patterned impression formed in the aluminum foil of the first capacitor and the aluminum foil of the second capacitor.

18. A method of making a capacitor, comprising the steps of:
   providing a conductor comprising a foil;
   providing a separator over the foil conductor;
   providing an insulator over the separator;
   rolling the foil conductor, separator, and insulator to form a capacitor cell; and
   mechanically forming a bond between the foil conductor and a foil conductor of another similarly formed capacitor cell.

19. The method of claim 18, wherein the separator comprises two layers.

20. The method of claim 18, wherein the separator comprises paper.

21. The method of claim 18, further comprising the step of configuring the capacitor as a capacitive voltage divider.

22. The method of claim 18, wherein the bond comprises a patterned impression formed in the foil conductor and the foil conductor of the another similarly formed capacitor cell.

* * * * *